US010424714B2

(12) United States Patent
Kemp et al.

(10) Patent No.: US 10,424,714 B2
(45) Date of Patent: Sep. 24, 2019

(54) PIEZOELECTRIC TRANSMITTER

(71) Applicant: The Board of Trustees of the Leland Stanford Junior University, Stanford, CA (US)

(72) Inventors: Mark A. Kemp, Belmont, CA (US); Matthew A. Franzi, Burlingame, CA (US); Erik N. Jongewaard, Boulder Creek, CA (US); Emilio A. Nanni, Redwood City, CA (US); Andrew A. Haase, Belmont, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 16/201,485

(22) Filed: Nov. 27, 2018

(65) Prior Publication Data

US 2019/0097119 A1 Mar. 28, 2019

Related U.S. Application Data

(63) Continuation-in-part of application No. 16/121,158, filed on Sep. 4, 2018.

(60) Provisional application No. 62/554,417, filed on Sep. 5, 2017.

(51) Int. Cl.
*H01L 41/04* (2006.01)
*H01L 41/053* (2006.01)
*H01L 41/107* (2006.01)
*H04B 1/04* (2006.01)
*H01L 41/187* (2006.01)
*H01L 41/18* (2006.01)

(52) U.S. Cl.
CPC .......... *H01L 41/044* (2013.01); *H01L 41/053* (2013.01); *H01L 41/107* (2013.01); *H04B 1/04* (2013.01); *H01L 41/18* (2013.01); *H01L 41/1873* (2013.01); *H01L 41/1876* (2013.01)

(58) Field of Classification Search
CPC ... H01L 41/044; H01L 41/053; H01L 41/107; H01L 41/18; H01L 41/1873; H01L 41/1876; H04B 1/04
See application file for complete search history.

(56) References Cited

U.S. PATENT DOCUMENTS 6,894,616 B1 * 5/2005 Forster ................ G06K 19/067
310/310

* cited by examiner

*Primary Examiner* — Nguyen T Vo
(74) *Attorney, Agent, or Firm* — Lumen Patent Firm

(57) ABSTRACT

A piezoelectric dipole transmitter is provided that includes a piezoelectric element, an insulating support disposed at a midpoint of said piezoelectric element, or along the piezoelectric element, an external capacitance driver, and an external modulation capacitance disposed proximal to a first end of the piezoelectric element, where the driver capacitance is driven by a signal appropriate to excite a lengthextensional acoustic mode of the piezoelectric element, where the piezoelectric element resonates at a piezoelectric element resonance frequency to radiate energy as an electric dipole.

12 Claims, 12 Drawing Sheets

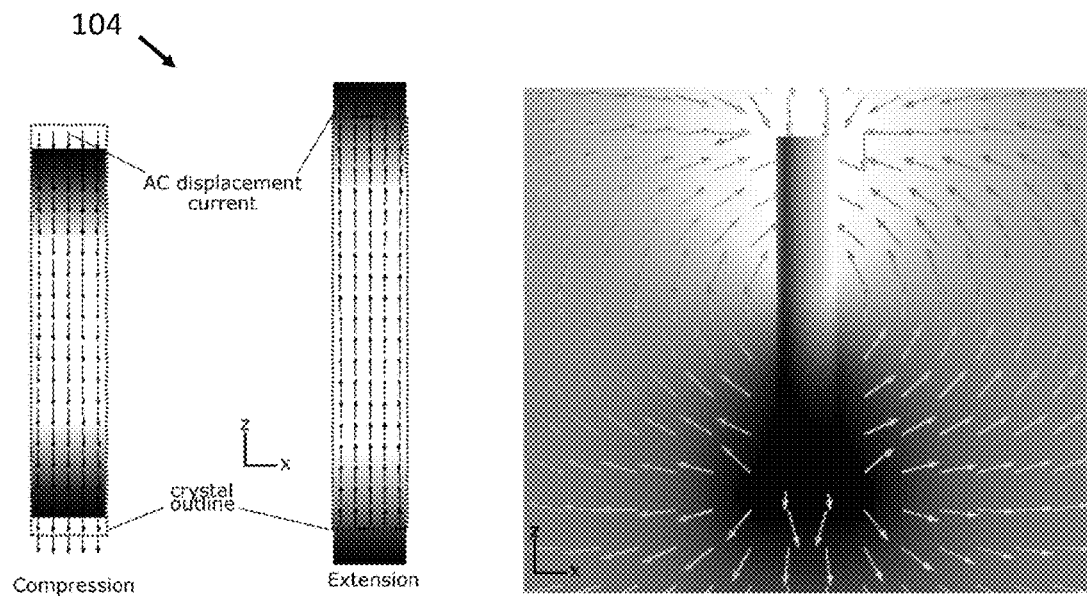
FIG. 6B  FIG. 6C
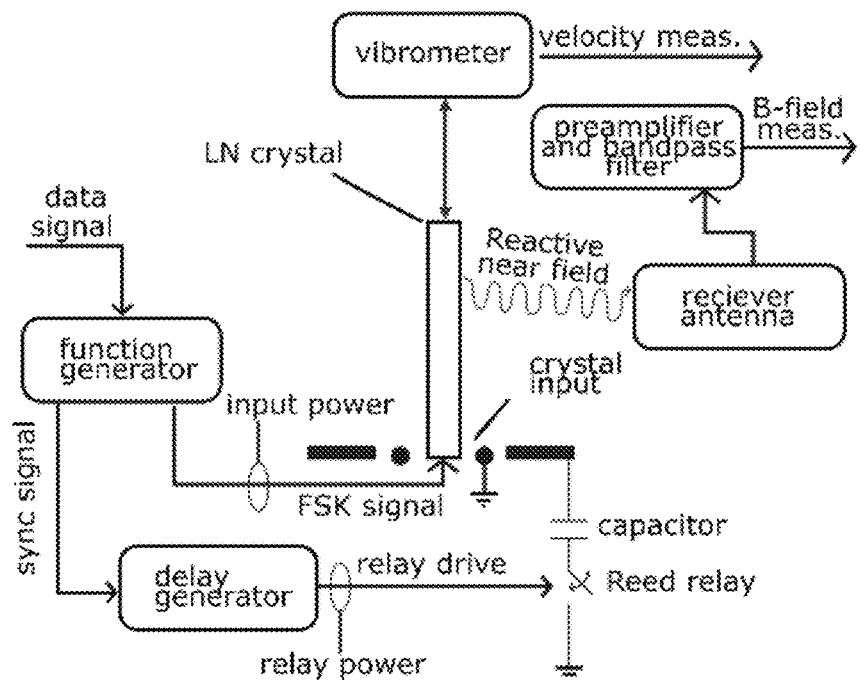
FIG. 6D

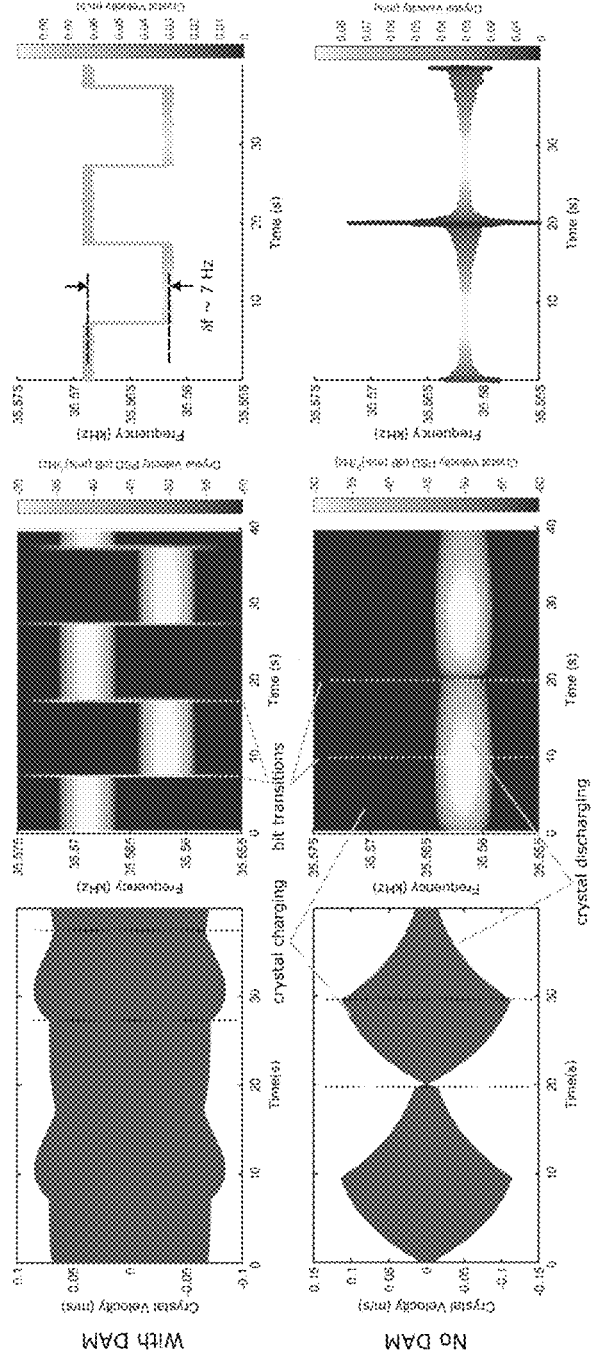

10,424,714 B2

PIEZOELECTRIC TRANSMITTER

CROSS-REFERENCE TO RELATED APPLICATIONS

This application is a continuation-in-part of U.S. patent application Ser. No. 16/121,158 filed Sep. 4, 2018, which is incorporated herein by reference. U.S. patent application Ser. No. 16/121,158 claims priority from U.S. Provisional Patent Application 62/554,417 filed Sep. 5, 2017, which is incorporated herein by reference.

STATEMENT OF GOVERNMENT SPONSORED SUPPORT

This invention was made with Government support under contract DE-AC02-76SF00515 awarded by the Department of Energy. The Government has certain rights in the invention.

FIELD OF THE INVENTION

The present invention relates generally to antenna transmitters. More particularly, the invention relates to a dipole piezoelectric transmitter.

BACKGROUND OF THE INVENTION

Ultra-Low Frequency and Very Low Frequency (VLF) communication systems (0.3-3 kHz and 3 kHz-50 kHz, respectively) have been used for many decades for a broad range of applications. These long-wavelength bands have applications not possible at higher frequencies. This is due to a few advantageous characteristics. While coupling to the earth-ionosphere waveguide, VLF signals have path attenuation less than 3 dB/1000 km. In addition, because the skin effect in materials is inversely proportional to frequency, VLF signals can penetrate 10's of meters into seawater or the earth, while higher frequency signals quickly are attenuated. For example, underwater communication with submarines is presently accomplished through large VLF transmitters located at many locations around the world.

Efficient VLF transmitters have traditionally necessitated radiating elements at the scale of the wavelength: several kilometers. This is because the radiation resistance, $R_{rad}$, of an electric dipole which scales as $(L/\lambda_0)^2$ where L is the electrical length of the antenna and $\lambda_0$ is the free space wavelength of the transmitting frequency. The radiation efficiency scales as $R_{rad}/R_{total}$ where $R_{total}$ is the total resistance of the antenna system including effects such as copper losses. Therefore, as the physical size of the antenna decreases, unless antenna losses are proportionally reduced, the efficiency dramatically reduces. This effect is exacerbated in the case of magnetic dipoles as the radiation resistance scales as $(L/\lambda_0)^4$.

Traditional metallic antennas much shorter than the radiating wavelength require large charge separation (dipole moments) and have huge input impedances, impractical for efficient and compact operation. To generate the large currents necessary to overcome their fundamentally low radiation efficiency, very high input voltages and impedance-matching networks are typically required.

What is needed is an antenna that is based upon the mechanical manipulation of charges, particularly in the Very Low Frequency (VLF, 3-30 kHz) band, to enable transmitters with a size and power consumption compatible with man-portable applications capable of closing communication links at distances greater than 100 km.

SUMMARY OF THE INVENTION

To address the needs in the art, a piezoelectric dipole transmitter is provided that includes a piezoelectric element, an insulating support disposed at a midpoint of the piezoelectric element or along the piezoelectric element, an external capacitance driver, and an external modulation capacitance disposed proximal to a first end of the piezoelectric element, where the driver capacitance is driven by a signal appropriate to excite a length-extensional acoustic mode of the piezoelectric element, where the piezoelectric element resonates at a piezoelectric element resonance frequency to radiate energy as an electric dipole.

According to one aspect of the invention, the piezoelectric element includes a cylindrical piezoelectric rod, a cuboid rod, or any shape that resonates in the length-extension acoustic mode.

In another aspect of the invention, the external modulation capacitance includes a plurality of concentric capacitor rings, or an external conductor having a controllable capacitance-to-ground.

In a further aspect of the invention, the piezoelectric element includes at least an n=2 vibration mode, where the of the piezoelectric element includes near zero-displacement at the center.

In yet another aspect of the invention, the piezoelectric radiating element has an output signal voltage of at least 100V.

According to one aspect of the invention, the piezoelectric element includes a material such as lithium niobate, quartz, PZT, or lithium tantalate.

In one aspect of the invention, the modulation capacitance charges and discharges at a frequency of at least 1 Hz.

In a further aspect of the invention, the external modulation capacitance and the external capacitance driver are configured for direct antenna modulation (DAM) to dynamically shift the piezoelectric element resonant frequency, where a Bode-Fano limit for high-bandwidth communications is bypassed.

According to another aspect of the invention, the external modulation capacitance and the external driver capacitance are configured for modulation by magnetic field biasing, modulating by external stress, or modulating an effective length of the resonator.

In yet another aspect of the invention, the resonating piezoelectric element has a Q-factor as low as 1,000 and a Q-factor greater than 600,000 with no external impedance matching network.

According to another aspect of the invention, the external capacitance actuator driver includes metalized electrodes disposed about a perimeter of the first end of the piezoelectric element, where a voltage applied across the metalized electrodes is the drive signal.

In another aspect, the invention further includes a mechanically-free mass load on one end of the piezoelectric crystal.

BRIEF DESCRIPTION OF THE DRAWINGS

FIGS. 6A-6F show (6A) Schematic of the LN rod mounting and excitation mechanisms also shown in FIG. 1, (6B) Mechanical displacement magnitude (in color, magnitude exaggerated for clarity) and the induced electric displacement vectors, (6C) Electric potential magnitude in color along with electric field vectors, (6D) Electrical schematic of input and output measurements, (6E) Simulated input impedance magnitude versus frequency, (6F) Simulated velocity and electric dipole moments versus frequency, according to the current invention.

FIGS. 8A-8F show measured effect of DAM to modulate a >300,000 Q resonator with a frequency separation of 7 Hz and an FSK rate of 0.05 Hz. (8A-8C) are with DAM, (8D-8F) are with no DAM. (8A, 8D) are the time-domain measurements, (8B, 8E) are the FFT, and (8C, 8D) are the Hilbert transforms. Note that one of the resonant frequencies is intentionally detuned to minimize the effect of different Qs on the amplitude of the output signal, according to the current invention.

DETAILED DESCRIPTION

The current invention provides vibrating piezoelectric elements to generate a large dipole moment and subsequently radiate VLF signals. Piezoelectric materials generate a displacement current in response to an applied time-varying stress. Operating near mechanical resonance, modest input excitation can generate large displacement currents. A piezoelectric resonator can radiate fields in a compact form factor by rendering unnecessary the large and inefficient electrical components required in traditional antennas. In effect, the piezoelectric device is simultaneously a high-current generator, high-Q matching network, and radiating antenna.

High Q communication systems are typically low bandwidth, which results in low bitrates. Typically, as high of a bitrate is possible is desirable. The general constraining relationships are the Chu limit and the Bode-Fano limits. Generically, these limits state that the achievable bandwidth scales as $f_c/Q$ where $f_c$ is the carrier frequency. With a carrier frequency of 35 kHz and a Q of 45,000, the achievable bandwidth would be ~0.75 Hz. A parametric modulation scheme, Direct Antenna Modulation (DAM), can bypass these limits. The current invention dynamically shifts the resonant frequency to widen the effective bandwidth.

According to one embodiment, the invention includes a piezoelectric-based electric dipole that radiates with >300× higher efficiency compared to the previous state of the art while achieving a bandwidth>88× beyond the Bode-Fano limit. A piezoelectric radiating element eliminates the need for large impedance matching networks as it self-resonates at the acoustic wavelength. The invention additionally achieves ultra-low losses with a high-Q>600,000 lithium niobate resonator system. To demonstrate a useable device bandwidth, the antenna is directly modulated, which increases the bitrate while still minimizing losses. Although demonstrated at VLF, the invention scales up and down to other frequency bands. The current invention provides new applications for portable, electrically small antennas.

Figure 1:
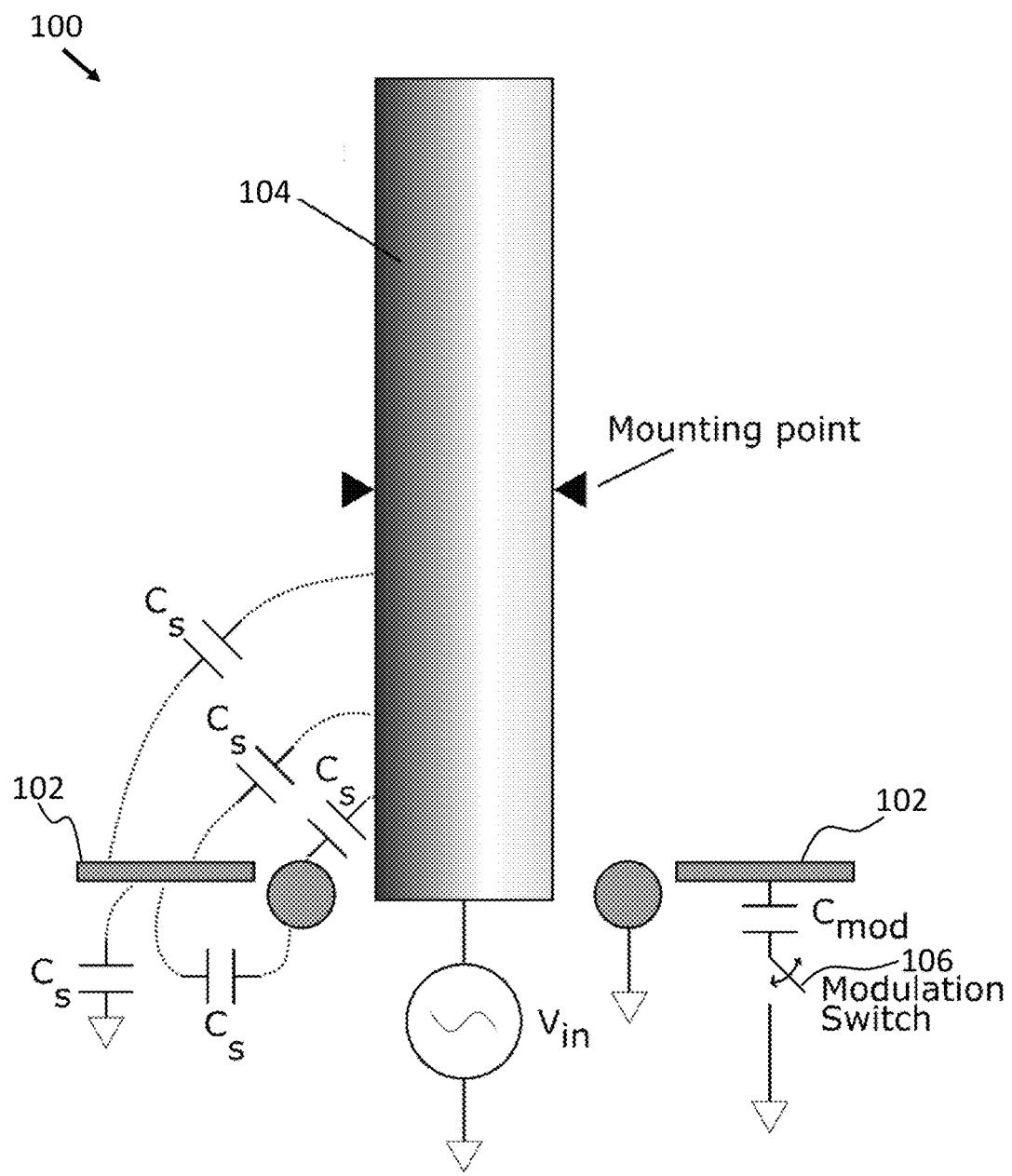
FIG. 1 shows a sketch of the transmitter. The device is axisymmetric about the center of the figure, according to one embodiment of the invention.
Figure 2:
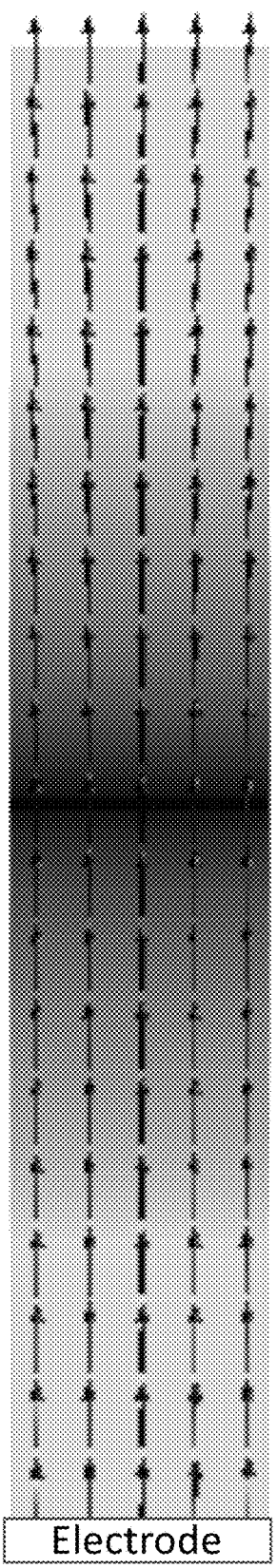
FIG. 2 shows multiphysics simulation of VAPOR. Shading represents mechanical displacement magnitude. Dark shading is little movement while light shading is high displacement. The arrows are the electric displacement vectors within the piezoelectric crystal, according to one embodiment of the invention.
Figure 3:
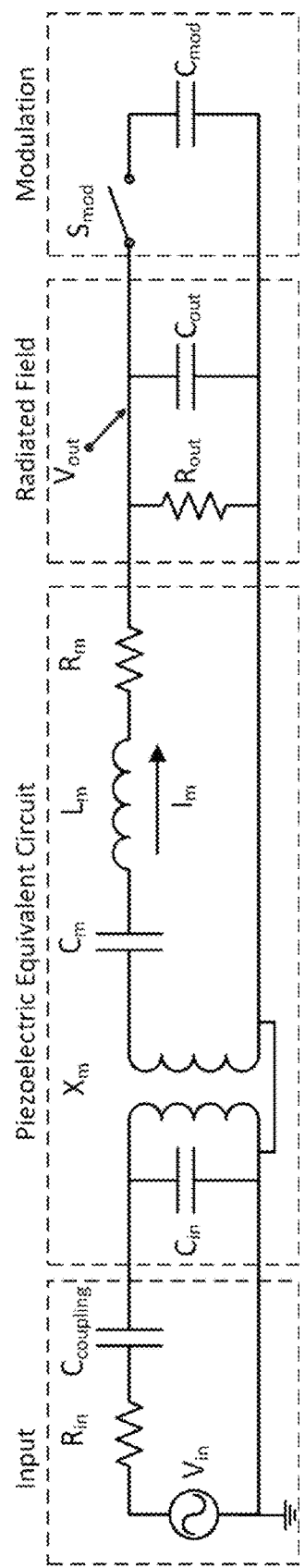
FIG. 3 shows a circuit schematic of VAPOR. Included are the input generator, the equivalent circuit for the piezoelectric resonator operating with one mode, the radiated field, and the modulation capacitance, according to one embodiment of the invention.
Figure 4:
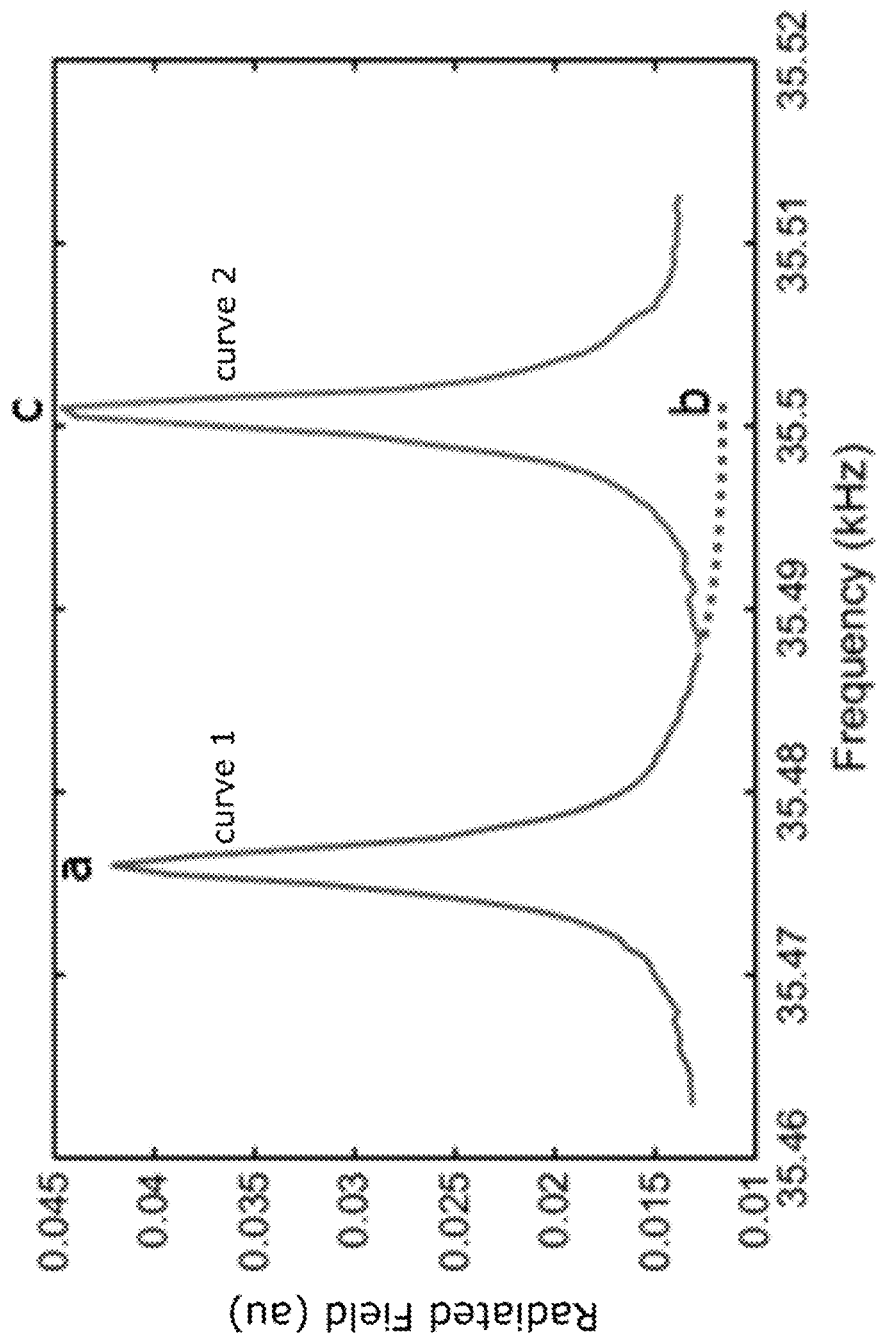
FIG. 4 shows radiated field at two different values of external capacitance. The bandwidth of each individual curve is dictated by the Q of the crystal. Without DAM, one would operate between points "a" and "b" on curve 1. DAM allows operation between bother curves, at the point of highest field, "a" and "c.", according to one embodiment of the invention.
Figures 5A, 5B:
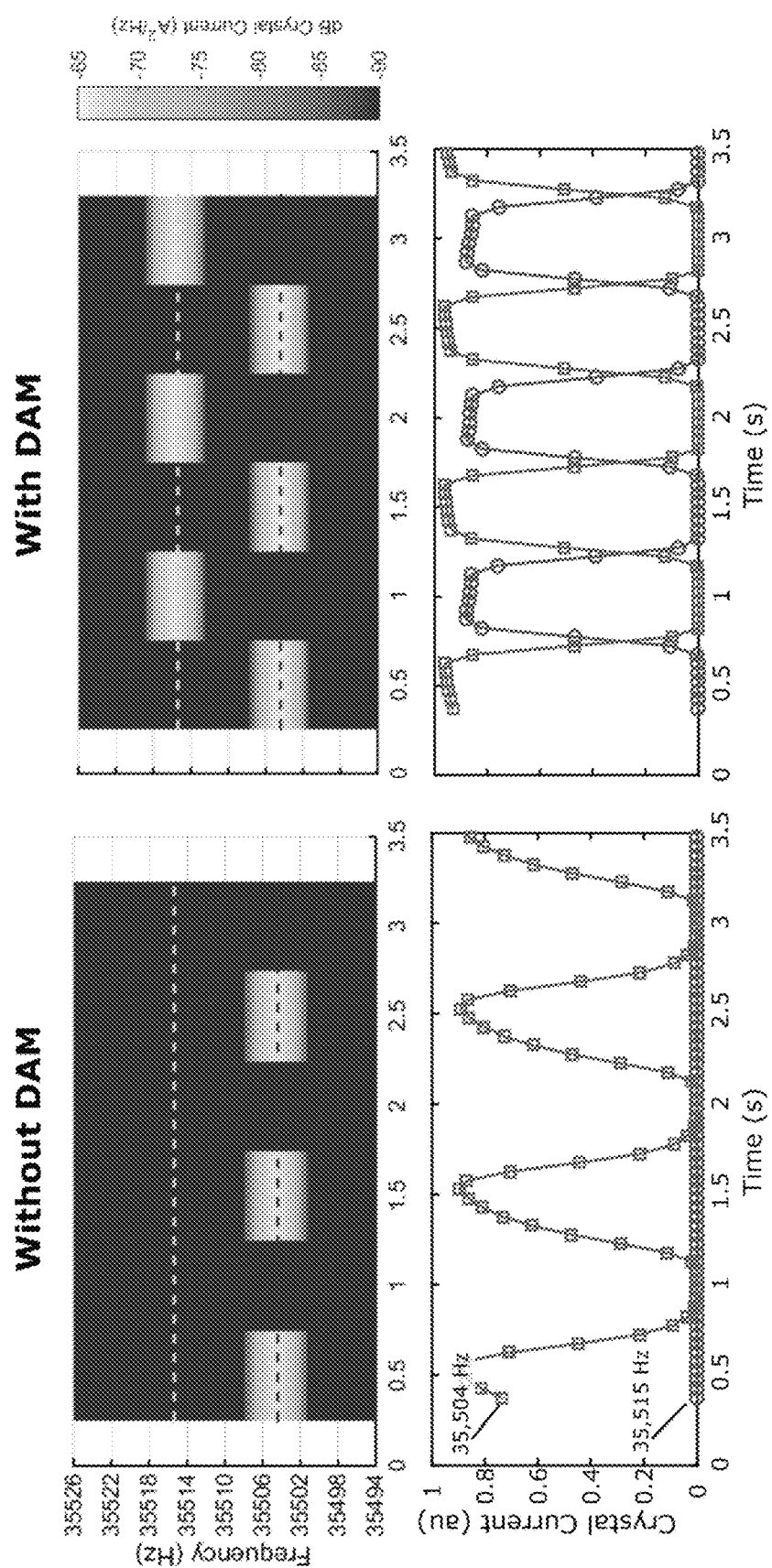
FIGS. 5A-5B show the effect of DAM on radiated field. (5A) spectrogram of input crystal current to the crystal with 500 ms FFT window. (5B) lineout of the two tones of interest. 250 ms window FFT with 200 ms overlap for each point, according to one embodiment of the invention.
Figure 6A:
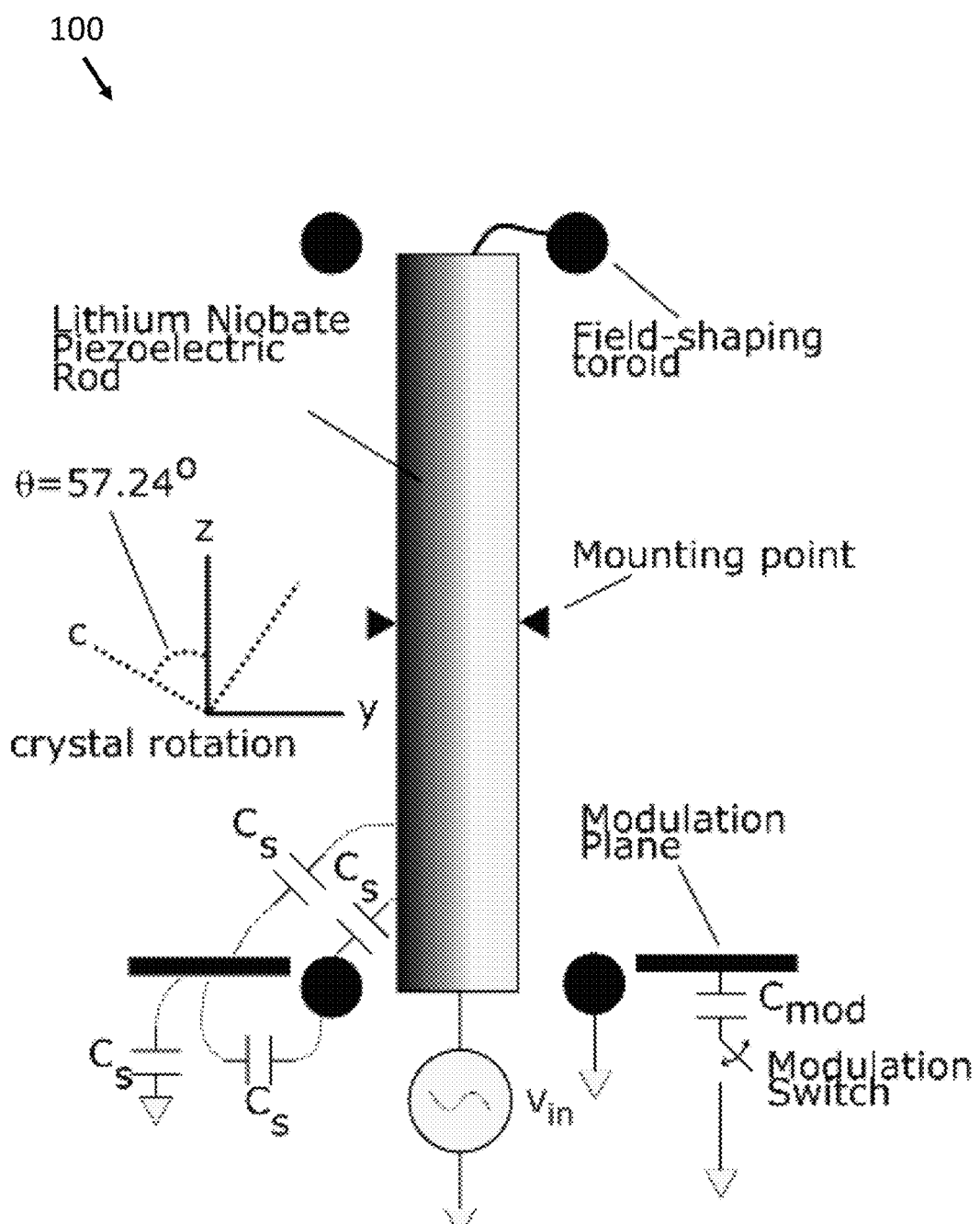
Figure 6E:
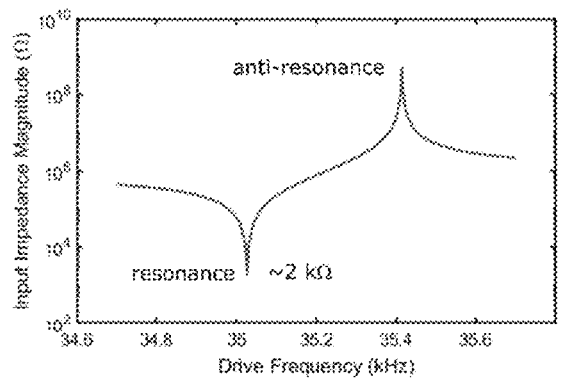
Figure 6F:
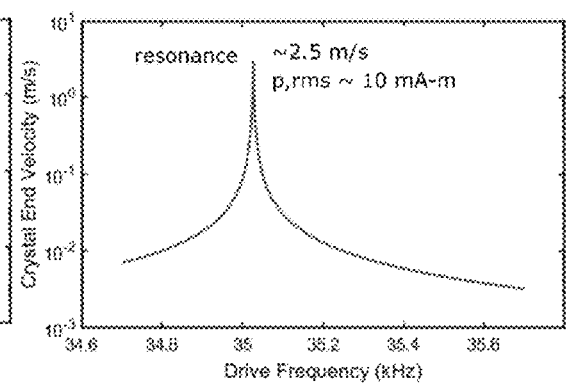

In one embodiment, the SLAC VLF Antenna Piezoelectric Resonator (VAPOR) concept utilizes a suitable piezoelectric material, such as for example Lithium Niobate (LN), as a length-extensional piezoelectric transformer. Radiation efficiency is maximized through mitigating the loss mechanisms of the material and the mechanical assembly. The resonator resonant frequency is dynamically tuned to achieve frequency modulation in a high-Q resonator. FIG. 1 and FIG. 6A show drawings of the VAPOR transmitter 100. The device is axisymmetric about the center of the figure, according to one embodiment of the invention. According to one aspect of the invention, the piezoelectric element includes a material such as lithium niobate, quartz, PZT, or lithium tantalate.

Demonstrating efficient, portable VLF transmitters requires technological advances in both the conceptual implementation and materials performance of piezoelectric resonators. The primary metric of enablement for the VAPOR device is to maximize the electric dipole moment while minimizing the dissipated power. According to one embodiment, size and weight are set to achieve a compact and transportable system. In one exemplary embodiment, the device includes 1) a LN resonator with a $Q_m$>600,000, 2) modulating the resonator at 500 Hz/sec, and 3) robust controls configured to transform the resonator into a communication system.

The current invention provides a transmitter enabled by three novel aspects. First, a length-extensional acoustic mode of a piezoelectric device is excited such that it resonates at VLF and radiates energy as an electric dipole. The use of a piezoelectric element as a radiator eliminates the need for large impedance matching elements. Second, an extremely high-Q single crystal (>600,000) is used to minimize antenna losses. While the radiation resistance is still low, the losses within the transmitter are dramatically reduced, and thereby increase the efficiency several orders of magnitude over what is presently achievable. Third, a novel technique of direct antenna modulation (DAM) is used to dynamically shift the resonant frequency of the crystal. This technique allows one to bypass the Bode-Fano limit for high-bandwidth communications.

The current invention includes several useful embodiments, for example in one embodiment a piezoelectric dipole transmitter is provided that includes a piezoelectric element, an insulating support disposed at a midpoint of the piezoelectric element, an external capacitance actuator driver, and an external capacitance actuator disposed proximal to a first end of the piezoelectric element, where the capacitance actuator is driven by the external capacitance actuator driver to output a capacitive drive signal configured to excite a length-extensional acoustic mode of the piezoelectric element, where the piezoelectric element resonates at a piezoelectric element resonance frequency to radiate energy as an electric dipole.

In one exemplary embodiment, VAPOR uses an external time-varying capacitance to modulate the resonant frequency. As shown in FIG. 1 and FIG. 6A, an electrically floating conductive plate 102 capacitively couples to the piezoelectric device 104 as well as ground. This is illustrated by various stray capacitances, $C_s$. One side of a fixed capacitance is connected to this floating plate 102, and the other end connects to one side of an electrical relay 106. The relay shorts and opens this capacitance to ground coincident with the change in the drive RF frequency. The two drive frequencies are chosen such that they match the resonant circuit with either the relay switch open or closed. In one example, the current embodiment operates with <2 W power consumption, <10 cm long, 35.5 kHz, and 10 mA-m dipole moment. A significant challenge in implementing electrically small antennas (ESA) with a wavenumber-length product ka<<1 is a high radiation Q, which significantly limits the achievable radiation efficiency. It has been established that for ESAs, the minimum achievable radiation Q, $Q_A$, scales as $1/(ka)^3$. Assuming a ka value of $7.5*10^{-5}$, previous work showed a "super-directive" antenna minimum $Q_A$ is $2*10^{13}$, about an order of magnitude higher than the minimum achievable radiation Q. In a lossy antenna, the total Q is $1/Q_t=(1/Q_m+1/Q_A)$ where $Q_m$ encompasses all losses within the antenna. For a large $Q_A$, $Q_m<<Q_A$ and thus $Q_t \approx Q_m$. Therefore, to maximize the efficiency of the transmitter, $\eta=Q_m/Q_A$, $Q_m$ must be maximized.

According to one aspect of the invention, the piezoelectric element can be a cylindrical piezoelectric rod, a cuboid rod, or a shape that resonates in the length-extension acoustic mode.

In other useful embodiments, the external capacitance actuator can include a plurality of concentric capacitor rings, or an external conductor having a controllable capacitance-to-ground.

In one aspect of the invention, the modulation capacitance charges and discharges at a frequency of at least 1 Hz.

According to another aspect of the invention, the external capacitance actuator and the external capacitance actuator driver are configured for modulation by magnetic field biasing, modulating by external stress, or modulating an effective length of the resonator.

In yet another aspect of the invention, the resonating piezoelectric element has a Q-factor as low as 1,000 and a Q-factor greater than 600,000 with no external impedance network.

According to another aspect of the invention, the external capacitance actuator driver includes metalized electrodes disposed about a perimeter of the first end of the piezoelectric element, where a voltage applied across the metalized electrodes is the drive signal.

In another aspect, the invention further includes a mechanically-free mass load on one end of the piezoelectric crystal.

An advantage of strain-based antennas is that they resonate at an acoustic frequency with physical dimensions much less than the electromagnetic wavelength. If effect, there is no need for large, external impedance-matching elements. Inefficiencies are compounded due to bulky, lossy impedance matching networks. Consider an electric dipole antenna made up of a copper wire normal to a ground plane. To impedance match to this antenna, a 10.5 H, 125 kV inductor is needed. The size and loss of this matching network, even assuming a high Q of 1,000, greatly exceed the antenna itself, making this technique unviable. Unfortunately, active "non-foster" matching networks are also unwieldy at such high voltages. A potential solution uses piezoelectric materials within transmitters. Radiation has been measured from vibrating quartz resonators and piezomagnetic or multiferroic antennas have enabled some improvements in electrically-small antennas. An advantage of strain-based antennas is acoustic resonance in a device with physical dimensions much less than the electromagnetic wavelength. Large, external impedance-matching elements are superfluous when the device is self-resonant.

Unfortunately, passive, high Q antennas have small bandwidths. The maximum fractional bandwidth, $$B = \frac{1}{Q_t}\left(\frac{vswr-1}{\sqrt{vswr}}\right) \quad (1)$$

of a transmitter is typically the Bode-Fano limit. Here, vswr is the voltage standing wave ratio (a value of 2, or 10% reflected power, is typically assumed). This implies that low-loss transmitters are low bandwidth and therefore, by the Shannon-Hartley theorem, have a comparatively low data bitrate. A common metric for evaluating ESAs is the bandwidth-efficiency product, $$B\eta = \left(\frac{1}{Q_t}\frac{vswr-1}{\sqrt{vswr}}\right)\left(\frac{Q_t}{Q_a}\right). \quad (2)$$

For a passive antenna, this relationship simplifies to $B\eta=1/(\sqrt{2}Q_a)$ which is only a function of $Q_a$, itself only a function of the antenna electrical size.

Direct Antenna Modulation (DAM) decouples bandwidth from $Q_t$. In frequency modulation embodiments of this concept, the antenna network resonant frequency is actively temporally shifted coincident with changes in the input drive frequency. DAM is necessary to operate at a frequency outside the fractional bandwidth of the passive antenna. For example, in a frequency shift keying (FSK) modulation scheme, the carrier and hop frequencies each correspond to a different resonant frequency (see FIG. 7) which changes at the FSK rate. Because an active antenna is not a linear time-invariant system, the Bode-Fano limit does not constrain the bandwidth. If both the frequency separation, $\delta f$, and $Q_m$ are maximized, a larger bandwidth-efficiency product is possible, $$B\eta = \left(\frac{\delta f}{f_c}\right)\left(\frac{Q_m}{Q_a}\right), \quad (3)$$

which has no strict upper bound. This is the fundamental advancement of the current invention: achieving a high $Q_m$ with no external impedance network in addition to a wide bandwidth.

As well as high bandwidth and efficiency, the radiated signal magnitude should be maximized. The electric dipole moment, p, in a bulk piezoelectric resonator scales as ~dV$\omega$T where d is the piezoelectric charge constant, V is volume, $\omega$ is the angular frequency, and T is material stress. Volume and frequency are specified, so the piezoelectric material choice should maximize the effective d, allowable stress, and Q. The $Q_m$ of the resonator system encompasses several mechanisms including mounting losses, external dampening, and internal losses in the piezoelectric material itself.

The Y∠36° cut of single crystal lithium niobite (LN) is advantageous as a resonator due to a yield stress>50 MPa as well as low intrinsic losses in bulk length-extensional modes, the second mode of which couples minimally to the mounting points. Also, the displacement current is in the same direction at all phases (thus, no canceling of fields) and loss mechanisms such as thermoelastic dissipation and Akhiezer damping are low. FIGS. 6B-6C show the electric dipole moment and external electric fields of this vibration mode. The LN is supported only at two points near the axial center and the input signal couples into the crystal by a potential applied across the metalized end of the crystal and an adjacent coaxial toroid (see FIG. 1, FIG. 6A, and FIG. 6D). The transversely coupled fields excite the length-extensional mode. At resonance, the input impedance is primarily resistive and both the velocity at the end of the crystal as well as the dipole moment are maximal. In addition, operation at resonance minimizes the necessary input voltage to generate a given dipole moment.

In a further embodiment of the invention, the external capacitance actuator includes at least an n=2 mode external capacitance actuator, where a center of the external capacitance actuator includes zero-displacement at a center of the external capacitance actuator. In other embodiments, higher order modes are equally valid. These are advantageous as one can radiate a higher frequency with a long-length material. For example, one could radiate (with the same setup) 35 kHz and 70 kHz.

In one exemplary embodiment, a 9.4 cm-long, 0.8 cm-diameter LN crystal is mounted between two quartz rods and the voltage and current inputs, crystal end velocity, and magnetic field at range are monitored. The velocity is instructive as the measurement is non-intrusive to transmitter operation and it directly correlates to the dipole moment. The measured $Q_t$, ~300,000, found from an exponential fit to the velocity ring-down and the geometry of the system are used as inputs to a multi-physics simulation. The model calculates the dipole moment, surface and near fields, and induced stress. Assuming a desired peak dipole moment of 14.1 mA-m (including image currents), the simulated average Von Mises stress is 60 MPa, voltage across the crystal is 125 kV, endplate velocity is 3 m/s, input impedance is 110 Ohms, average power dissipation is 120 mW, and the input voltage is 5.3 V.

In yet another aspect of the invention, the piezoelectric radiating element has an output signal voltage of at least 100V.

The passive fractional bandwidth of a system with a $Q_t$ of 300,000 is 2.36*10$^{-6}$, or 84 mHz at a carrier frequency of 35.5 kHz. The piezoelectric resonator is a harmonic oscillator with parameters such as stiffness, mass, and external capacitance determining the resonant frequencies. Wide modulation is possible by taking advantage of the strong dependence of resonant frequency on stray capacitance. With the DAM technique, a time-varying capacitance modulates the resonant frequency outside the passive system bandwidth. A conductive "modulation plate" capacitively couples to the piezoelectric device and ground. A discrete capacitor couples the modulation plate to an electrical relay, which shorts and opens this capacitance to ground coincident with the change in the drive RF frequency. The two drive frequencies match the resonant frequency either with the relay open or closed.

For high efficiency, the modulation mechanism must not spoil the Q. Efficient modulation converts the energy resonating at one frequency to the second frequency. Velocity or magnetic field magnitude during modulation is the same as when the transmitter resonates at only one frequency. If one tone is higher or lower magnitude than the other during modulation, then the tuning of the input drive frequency to the two resonant frequencies is not matched. Also, the average input power to the crystal ideally is constant regardless of the modulation rate.

Figure 7:
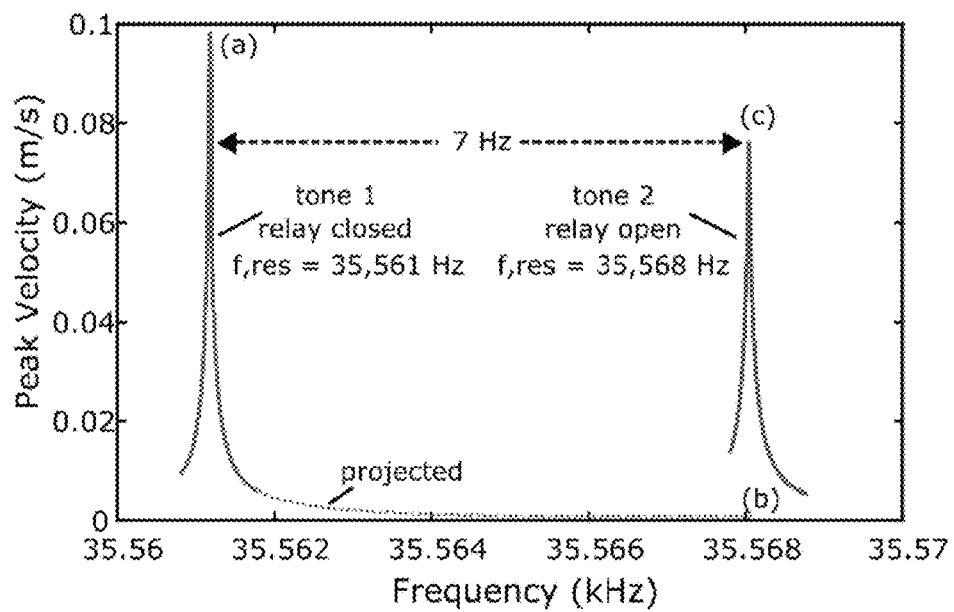
FIG. 7 shows measured peak crystal velocity at two values of external capacitance (the modulation relay open or closed). The bandwidth of each individual curve is <0.1 Hz. Without DAM, one would operate between points "a" and "b" on the red curve 1. DAM allows operation between both curves, at the point of highest field, "a" and "c." Tone one has a measured Q of 615,000 and tone two has a measured Q of 303,000, according to the current invention.
Figure 9A:
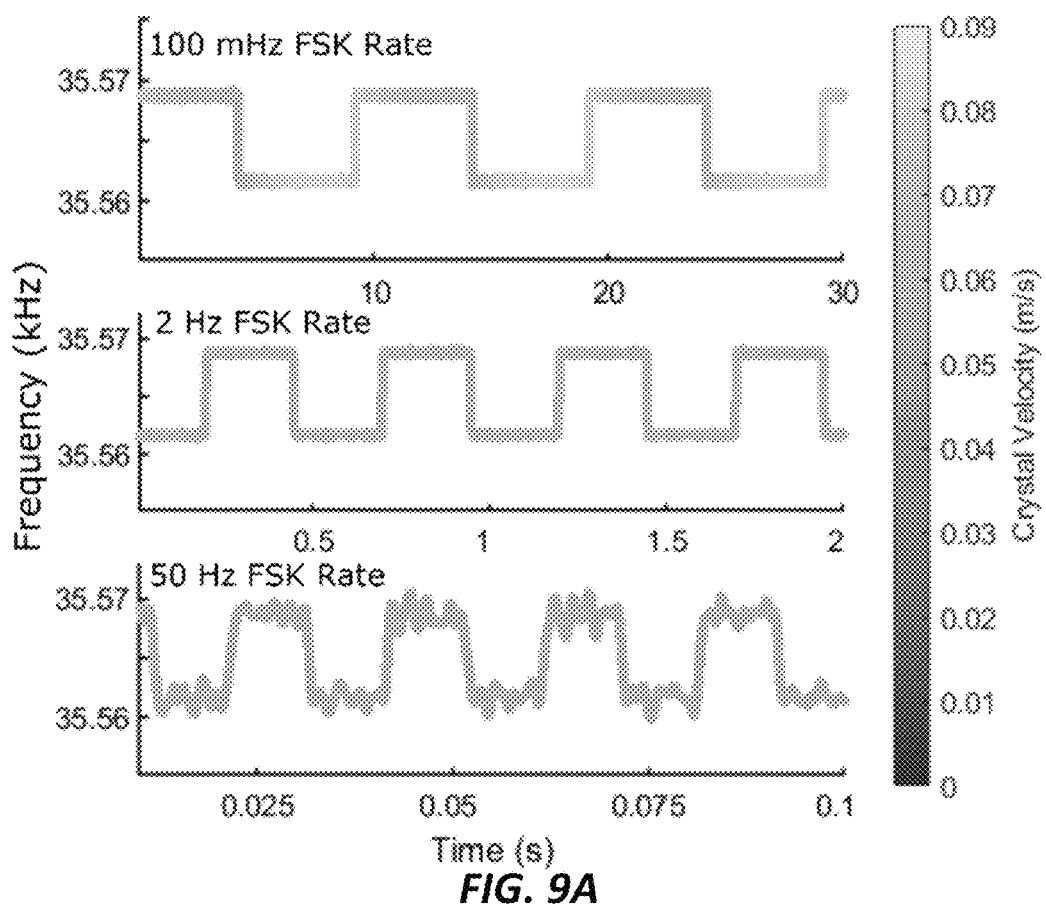
FIGS. 9A-9B show (9A) measured crystal velocity for three different FSK rates using DAM. The two frequencies are clearly distinguishable for all rates and the velocity magnitude decreases only slightly from ~0.07 m/s peak at 100 mHz to ~0.06 m/s peak at 50 Hz. (9B) update measured field at range.
Figure 9B:
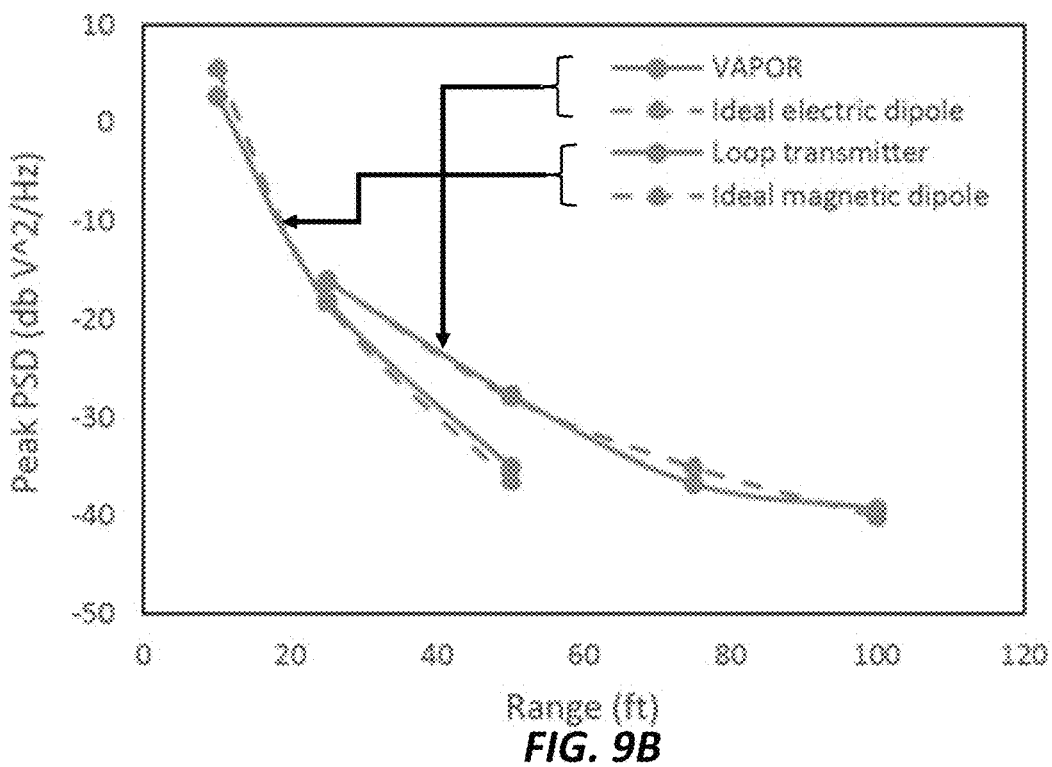

With an embodiment using a CW signal, the applied frequency is swept with the electrical relay in the closed position, then in the open position (see FIG. 7). The measured Q is different (500 k versus 300 k) for these two states, attributed to differing losses within the relay. As such, to achieve approximately constant amplitude during modulation, the higher-Q signal is driven slightly off resonance. A 50% duty cycle FSK waveform is input to the crystal with frequency transitions synchronized to the electrical relay opening or closing. For the "without DAM" case, the relay is static in the closed position. FIGS. 8A-8F show results with an FSK rate of 0.05 Hz both with and without DAM. The time domain results show that without DAM, the crystal slowly charges and discharges depending upon the drive frequency, while the amplitude with DAM is relatively constant. The FFT and Hilbert transforms of this data show that only one frequency is visible in the without DAM case while both frequencies are clearly distinguishable with DAM. As the FSK rate is increased, the amplitude with DAM remains high, as shown in FIGS. 9A-9B.

In a further embodiment, the invention is a piezoelectric dipole transmitter that includes a piezoelectric element, a piezoelectric actuator attached to one end of the piezoelectric element, a capacitive plate that is proximal to the piezoelectric crystal and the piezoelectric actuator, a piezoelectric actuator driver having an output drive signal voltage in a range of 10V-1 kV, and a frequency in a range of 1 kHz-1 MHz, and a capacitive plate driver configured to charge and discharge the capacitive plate at a frequency in a range of 1 Hz-1 kHz. Here, the piezoelectric element includes a material such as lithium niobate, quartz, PZT, and lithium tantalate. In one aspect, the current embodiment further includes a mechanically-free mass load on one end of the piezoelectric crystal. In another aspect, the external capacitance actuator driver has a frequency of 1 kHz-1 MHz.

The current invention was also tested to high field levels in a hexafluoroethane-filled dielectric chamber. Particular care was taken to both minimize the input electrical leads as well as account for any RFI. Due to additional damping introduced by this electrically insulating gas, the Q for these tests is <30,000. Both the electric and magnetic field were measured versus range in the near field. Shown in FIGS. 9A-9B, a fit to each of these curves yields the electric dipole.

These results illustrate only one application for this technique. Even wider frequency separation for the modulation is attainable through further optimization of the modulation plate geometry. Different carrier frequencies are attainable through adjustment of the length of the piezoelectric element. Further, operation at harmonic frequencies is possible through higher mode excitement. Arraying of the piezoelectrics is straightforward, particularly as they can strongly couple and through careful design, phase-lock. The piezoelectric material is not limited to lithium niobate and can be tailored to the application (see Table I.). Varying operation in air, vacuum, or other background gasses can help balance between heat removal, high-field operation, and vibration damping.

TABLE I

Comparison of the nominal properties of lithium niobite to other piezoelectric materials.

| | Y∠36° cut LN | Quartz | PZT-8 |
|---|---|---|---|
| $d_{effective}$ | $3.9 * 10^{-11}$ m/V | $2.3 * 10^{-12}$ | $2.2 * 10^{-10}$ m/V |
| $Q_m$ | >600,000 | >180,000 | ~1,000 |
| $T_{yield}$ | >50 MPa | 48 MPa | 35 MPa |
| $E_{max}$ | >22 MV/m | 50 MV/m | 2 MV/m |

Figure 10A:
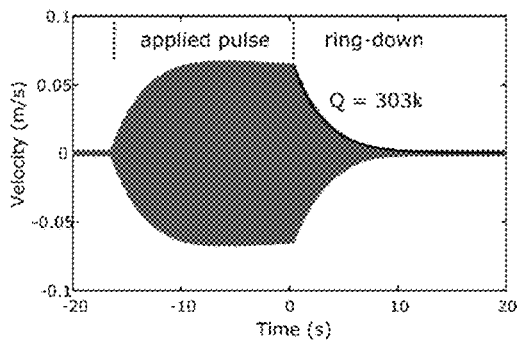
FIGS. 10A-10B show measured ring-down waveforms with the modulation electrical relay (10A) open and (10B) closed, according to the current invention.
Figure 10B:
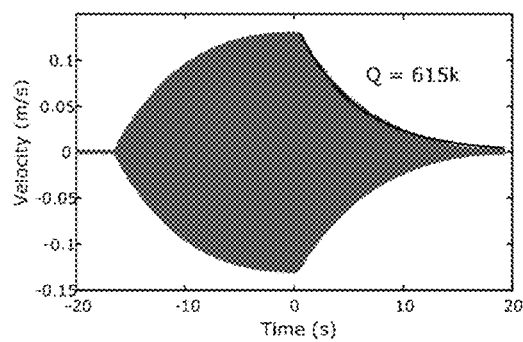
Figure 11A:
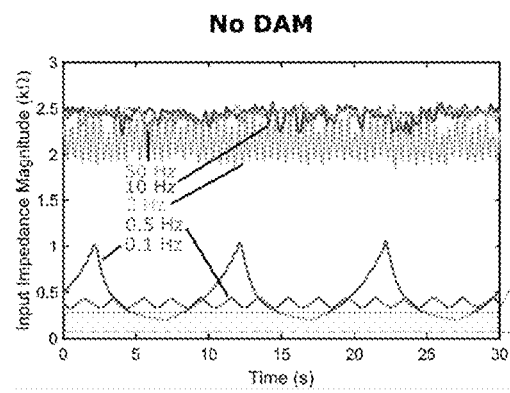
FIGS. 11A-11D show time varying impedance and input power for DAM versus non-DAM. Various FSK rates are shown. As the FSK rate increases, the input power goes to zero for the no-DAM case as the crystal does not resonate at either tone. The impedance slightly increases for the DAM case versus increasing FSK rate, and the input average power slightly decreases. However, the change in both is <50%, consistent with the high measured velocity versus FSK rate shown in FIGS. 8A-8F.
Figure 11B:
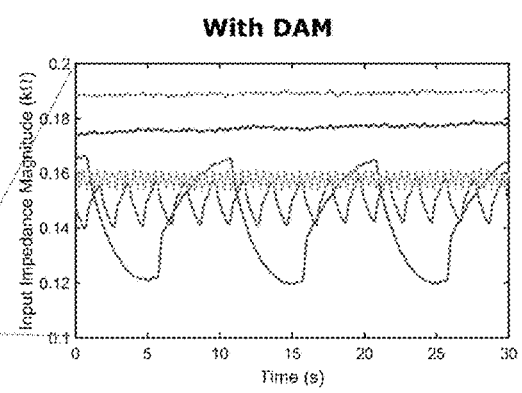
Figure 11C:
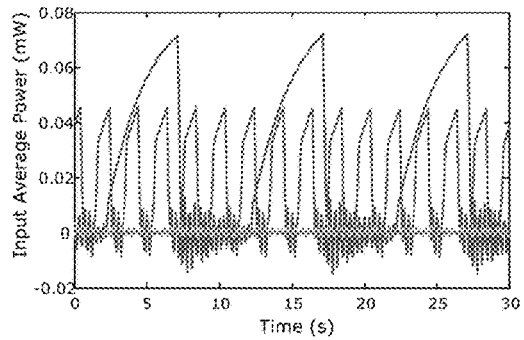
Figure 11D:
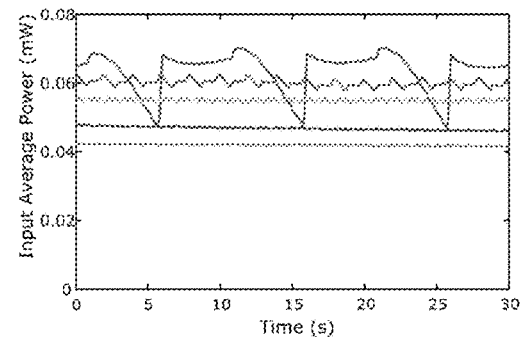

FIGS. 10A-10B show measured ring-down waveforms with the modulation electrical relay (10A) open and (10B) closed, according to the current invention.

FIGS. 11A-11D show time varying impedance and input power for DAM versus non-DAM. Various FSK rates are shown. As the FSK rate increases, the input power goes to zero for the no-DAM case as the crystal does not resonate at either tone. The impedance slightly increases for the DAM case versus increasing FSK rate, and the input average power slightly decreases. However, the change in both is <50%, consistent with the high measured velocity versus FSK rate shown in FIGS. 8A-8F.

Figure 12A:
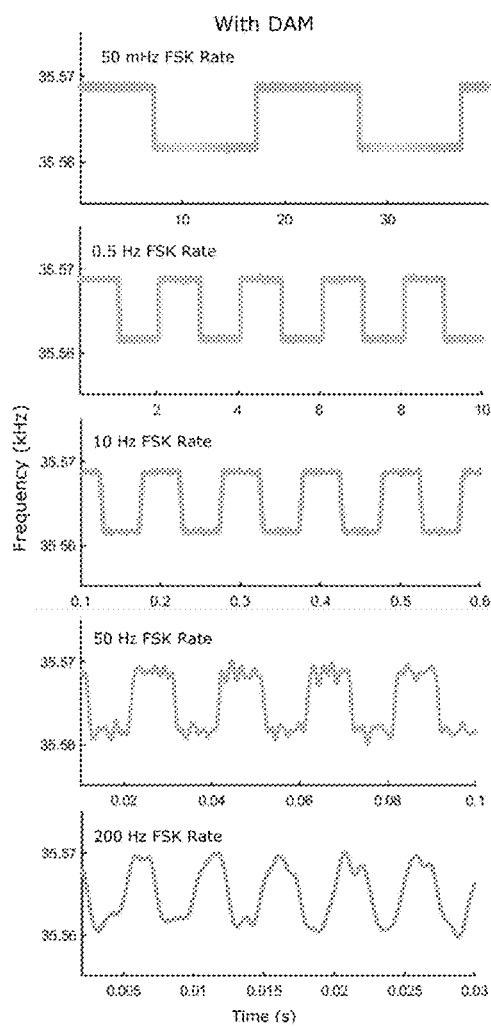
FIGS. 12A-12B show Hilbert transforms of crystal velocity (12A) with DAM and (12B) without DAM. At the higher FSK rates, the "no DAM" waveforms exhibit minimal delineation of frequency.
Figure 12B:
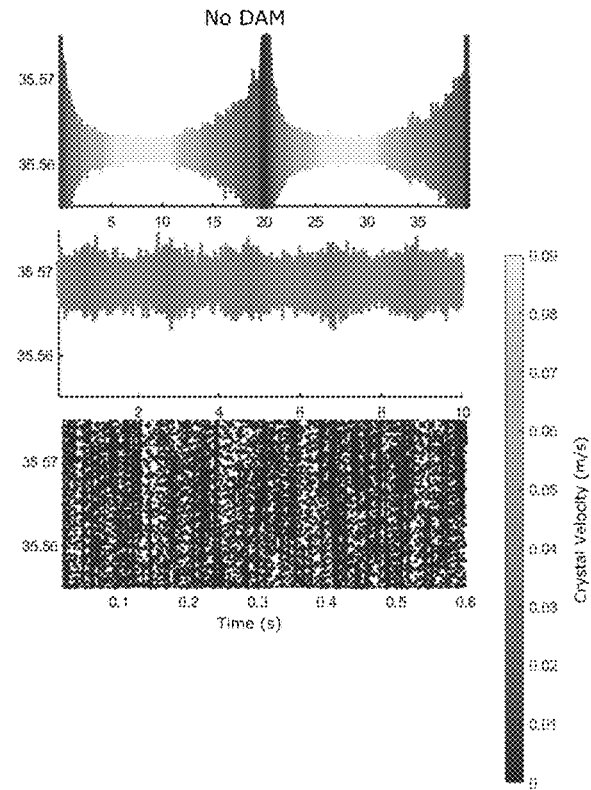

FIGS. 12A-12B show Hilbert transforms of crystal velocity (12A) with DAM and (12B) without DAM. At the higher FSK rates, the "no DAM" waveforms exhibit minimal delineation of frequency.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, the length-extensional piezoelectric electric dipole is one of many potential implementations of the technique. One example extension is to excite a higher order even mode, which includes zero displacement at the center or possibly a higher order mode where the device is held at one or more points not at the axial center. In addition, shear or rotational modes will also radiate and may be advantageous based upon the application. Other than a bar structure, a resonating structure such as a wine-glass element or disk element can also be used. These other operating modes can be configured to radiate as a magnetic dipole or as a hybrid between several radiating types.

The energy can be coupled into the crystal via a capacitive drive as described above or through electrodes on or within one or more piezoelectric elements. Several elements can be arrayed together to radiate as one effective unit. As the piezoelectric devices couple, one or more applied drives can drive many components at once. Also, RF energy can drive the piezoelectric antenna via an applied magnetic field if there is magnetic material bonded to the piezoelectric device.

All such variations are considered to be within the scope and spirit of the present invention as defined by the following claims and their legal equivalents.

What is claimed:

1. A piezoelectric dipole transmitter, comprising:
   a) a piezoelectric element;
   b) an insulating support disposed at a midpoint of said piezoelectric element, or along said piezoelectric element;
   c) an external capacitance driver; and
   d) an external capacitor disposed proximal to said piezoelectric element, wherein said external capacitor is capacitively coupled to said piezoelectric element, wherein said external capacitor is driven by said external capacitance driver, wherein said external capacitance driver comprises a signal appropriate to excite a length-extensional acoustic mode of said piezoelectric element, wherein said piezoelectric element resonates at a piezoelectric element resonance frequency to radiate energy as an electric dipole.

2. The piezoelectric dipole transmitter of claim 1, wherein said piezoelectric element comprises a cylindrical piezoelectric rod, a cuboid rod, or a shape that resonates in said length-extension acoustic mode.

3. The piezoelectric dipole transmitter of claim 1, wherein said external capacitor comprises a plurality of concentric capacitor rings, or an external conductor having a controllable capacitance-to-ground.

4. The piezoelectric dipole transmitter of claim 1, wherein said piezoelectric element comprises at least an n=2 vibration mode, wherein a displacement of said midpoint of said piezoelectric element comprises essentially a near zero-displacement.

5. The piezoelectric dipole transmitter of claim 1, wherein said piezoelectric element has an output signal voltage of at least 100V.

6. The piezoelectric dipole transmitter of claim 1, wherein said piezoelectric element comprises a material selected from the group consisting of lithium niobate, quartz, PZT, and lithium tantalate.

7. The piezoelectric dipole transmitter of claim 1, wherein a modulation capacitance charges and discharges at a frequency of at least 1 Hz.

8. The piezoelectric dipole transmitter of claim 1, wherein an external modulation capacitance and said external capacitance driver are configured for direct antenna modulation (DAM) to dynamically shift said piezoelectric element resonant frequency, wherein a Bode-Fano limit for high-bandwidth communications is bypassed.

9. The piezoelectric dipole transmitter of claim 1, wherein said external capacitor and said external capacitance driver are configured for modulation of said piezoelectric element by magnetic field biasing, modulating said piezoelectric element by an external stress, or modulating an effective length of said piezoelectric element.

10. The piezoelectric dipole transmitter of claim 1, wherein said resonating piezoelectric element has a Q-factor as low as 1,000 or a Q-factor greater than 600,000 with no external impedance matching network.

11. The piezoelectric dipole transmitter of claim 1, wherein said external capacitor comprises metalized electrodes disposed about a perimeter of said piezoelectric element, wherein a voltage applied across said metalized electrodes is said drive signal.

12. The piezoelectric dipole transmitter of claim 1 further comprising a mechanically-free mass load on one end of said piezoelectric element.

* * * * *